United States Patent
Yamaguchi

(10) Patent No.: US 10,388,725 B2
(45) Date of Patent: Aug. 20, 2019

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventor: Kazuya Yamaguchi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/878,841

(22) Filed: Jan. 24, 2018

(65) Prior Publication Data
US 2018/0269278 A1 Sep. 20, 2018

(30) Foreign Application Priority Data
Mar. 14, 2017 (JP) .................. 2017-049245

(51) Int. Cl.
| | |
|---|---|
| *H01L 29/06* | (2006.01) |
| *H01L 29/739* | (2006.01) |
| *H01L 29/423* | (2006.01) |
| *H01L 29/78* | (2006.01) |
| *H01L 29/66* | (2006.01) |
| *H01L 21/265* | (2006.01) |

(Continued)

(52) U.S. Cl.
CPC ...... *H01L 29/063* (2013.01); *H01L 21/26513* (2013.01); *H01L 21/76202* (2013.01); *H01L 29/0634* (2013.01); *H01L 29/0649* (2013.01); *H01L 29/1095* (2013.01); *H01L 29/4238* (2013.01); *H01L 29/66348* (2013.01); *H01L 29/66734* (2013.01); *H01L 29/7396* (2013.01); *H01L 29/7397* (2013.01); *H01L 29/7811* (2013.01); *H01L 29/7813* (2013.01); *H01L 29/1608* (2013.01); *H01L 29/402* (2013.01)

(58) Field of Classification Search
None
See application file for complete search history.

(56) References Cited

U.S. PATENT DOCUMENTS

| | | | |
|---|---|---|---|
| 2007/0114602 A1 | 5/2007 | Saito et al. | |
| 2008/0315297 A1 | 12/2008 | Takashita et al. | |
| 2009/0014784 A1* | 1/2009 | Venkatraman | ...... H01L 29/7813 257/330 |

FOREIGN PATENT DOCUMENTS

| | | |
|---|---|---|
| JP | 2007-149736 A | 6/2007 |
| JP | 2009-004668 A | 1/2009 |
| JP | 2009-004688 A | 1/2009 |

* cited by examiner

*Primary Examiner* — Herve-Louis Y Assouman
(74) *Attorney, Agent, or Firm* — Rabin & Berdo, P.C.

(57) ABSTRACT

A semiconductor device including an active region for main current thereof to flow therein and an edge termination region surrounding the active region. The semiconductor device includes a substrate, a drift layer provided on a first main surface of the substrate, a semiconductor layer provided in a surface layer of the drift layer, a trench formed in the active region and reaching the drift layer from a surface of the semiconductor layer, a gate electrode provided in the trench via a gate insulating film, a gate metal formed in the edge termination region and connected with the gate electrode, a gate contact formed in the edge termination region, and having a top thereof in contact with the gate metal, and a semiconductor region that is provided in the surface layer of the drift layer, extends from the active region to the edge termination region, and is connected with the semiconductor layer and a bottom of the gate contact.

9 Claims, 12 Drawing Sheets

(51) Int. Cl.
*H01L 21/762* (2006.01)
*H01L 29/10* (2006.01)
H01L 29/16 (2006.01)
H01L 29/40 (2006.01)

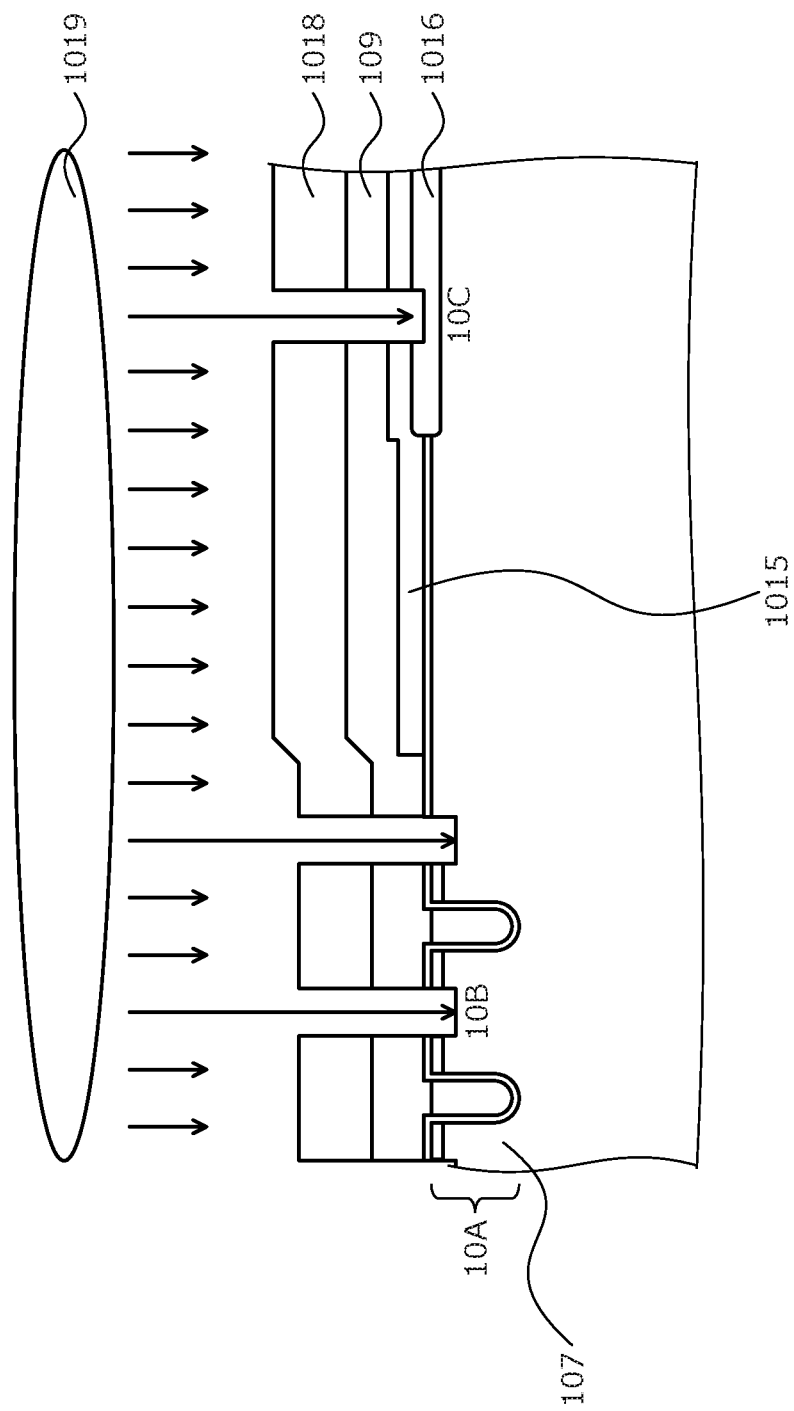

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2017-049245, filed on Mar. 14, 2017, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

In general, in power metal oxide semiconductor field effect transistors (MOSFETs), there is a tradeoff relationship between ON resistance and breakdown voltage. For example, in the case of an ordinary planar n-channel vertical MOSFET, a part that is a high-resistance n$^-$-type drift layer acts as a region through which drift current flows in a vertical direction when the MOSFET is in an ON state. This part is depleted and increases the breakdown voltage when the MOSFET is in an OFF state. Shortening the current path in this high-resistance n$^-$-type drift layer reduces the drift resistance, leading to an effect of substantially reducing the ON resistance of the MOSFET. However, conversely, the width that a depletion layer between the drain and the base spreads, progressing from a pn junction between the p-type base region and the n$^-$-type drift layer decreases and the critical electric field strength of silicon (Si) is quickly reached whereby the breakdown voltage decreases.

Meanwhile, with a high-voltage semiconductor device, the n$^-$-type drift layer is thick whereby inevitably the ON resistance increases, increasing loss. In this way, there is a tradeoff between the ON resistance and breakdown voltage. A super junction (SJ)-MOSFET having a SJ structure is a solution to this problem. The drift layer is constituted by a parallel pn structure (SJ structure) in which a p-type region and an n-type region having a high impurity concentration are alternately arranged; and in the OFF state, the drift layer is depleted so as to bear the breakdown voltage.

A structural difference from an ordinary planar n-channel vertical MOSFET is a parallel pn structure (SJ structure) in which a vertically stacked n-type drift region and a vertically stacked p-type partition region are alternately joined to each other whereby the drift part is not a uniform, single conductivity type. Even when an impurity concentration of parallel pn structure is high, in the OFF state, a depletion layer from pn junctions oriented in a vertical direction of the parallel pn structure expands bilaterally in the horizontal direction whereby the drift region is depleted overall, enabling a high breakdown voltage.

To realize a high voltage and a low ON resistance in a SJ-MOSFET, size reduction is necessary. In achieving size reduction, application of a trench gate and trench contact is effective (for example, refer to Japanese Laid-Open Patent Publication No. 2007-149736). A trench side wall is used as a channel by a method of configuring a gate in a groove formed in silicon, making it possible to reduce the size of the trench gate. Further, by a method of forming a contact region in a groove formed in silicon, contact is made with a source and contact is made with a p$^+$-type layer at the trench bottom, making it possible to reduce the size of the trench contact.

FIG. 10 is a cross-sectional view of a structure of a conventional SJ-MOSFET. As depicted in FIG. 10, the SJ-MOSFET uses, as a material, a wafer in which an n-type drift layer 1050 is grown on an n$^+$-type drain layer 101 having a high impurity concentration. The SJ-MOSFET includes an active region 1020 and an edge termination region (edge part) 1030 surrounding a periphery of the active region 1020. Here, the edge termination region 1030 is a region in which a gate wiring 1015 (described hereinafter) is provided and the active region 1020 is a region inside the edge termination region 1030. In the active region 1020, from a surface of the wafer, a p-type column region 103 is provided penetrating the n-type drift layer 1050 but not reaching the n$^+$-type drain layer 101. In n-type drift layer 1050, a region in which the p-type column region 103 is not provided is an n-type column region 102. In FIG. 10, although the p-type column region 103 does not reach the n$^+$-type drain layer 101, the p-type column region 103 may reach the n$^+$-type drain layer 101.

In a surface of the n-type column region 102 and the p-type column region 103, a p-type base layer 107 is provided. On a front surface side of the p-type base layer 107, a trench gate 10A and a trench contact 10B are provided. Along sidewalls of the trench gate 10A, a gate insulating film 105 is provided, and a gate electrode 106 is provided on the gate insulating film 105. A bottom of the trench gate 10A is in contact with the n-type column region 102. Further, in the p-type base layer 107, an n-type source region 108 and a p$^+$-type contact region 1010 are provided. The p$^+$-type contact region 1010 is provided at a bottom of the trench contact 10B. A source electrode 1011 is provided in contact with the n-type source region 108 at a sidewall of the trench contact 10B and in contact with the p$^+$-type contact region 1010 at the bottom of the trench contact 10B. The source electrode 1011 and the gate electrode 106 are insulated by an interlayer insulating film 109. Further, on a rear surface of the n$^+$-type drain layer 101, a drain electrode 104 is provided.

In the edge termination region 1030, which sustains the breakdown voltage, a p-type RESURF region 1012 is provided (for example, refer to Japanese Laid-Open Patent Publication No. 2007-149736). A concentration of electric field at an end of a p-type well region 1013 provided on the n-type column region 102 and the p-type column region 103 that are outermost is mitigated by the p-type RESURF region 1012, enabling the breakdown voltage of the edge termination region 1030 to be increased. Further, poly-silicon (poly-Si) of the gate electrode 106 embedded in the trench gate 10A is lead out from a terminal of the trench gate 10A and is connected with the gate wiring 1015. Further, in the edge termination region 1030, the poly-silicon is in contact with a gate metal 1017 at a gate contact 10C. The n-type drift layer 1050 is insulated from the gate metal 1017 and the gate wiring 1015 by a local oxidation of silicon (LOCOS) oxide film 1016.

For example, in an edge region of a semiconductor device that has drift layer of a pillar structure in which a first semiconductor layer of a first conductivity type and a second semiconductor layer of a second conductivity type are periodically and alternately formed, a P-type RESURF layer is formed in the surface so as to be in contact with a P+-type guard ring layer and so as to spread on an opposite side from an element region (for example, refer to Japanese Laid-Open Patent Publication No. 2009-4688).

SUMMARY OF THE INVENTION

According to an embodiment of the present invention, a semiconductor device includes a semiconductor substrate of a first conductivity type; a drift layer of the first conductivity type provided on a first main surface of the semiconductor substrate; a first semiconductor layer of a second conductivity type provided in a surface layer of the drift layer; and an active region in which main current flows, the active region including: a trench reaching the drift layer from a surface of the first semiconductor layer, and a gate electrode provided in the trench, via a gate insulating film. The semiconductor device further includes a termination region surrounding a periphery of the active region, the termination region including a gate contact with which a gate metal connected with the gate electrode is in contact. The termination region has a first semiconductor region of the second conductivity type. The first semiconductor region is connected with the first semiconductor layer and extends to a bottom of the gate contact.

In the embodiment, the semiconductor device further includes an insulating film provided in the termination region, between the first semiconductor region and the gate metal. A thickness of the insulating film beneath the bottom of the gate contact is thinner than a thickness of the insulating film in a region where the gate contact is not provided.

In the embodiment, the thickness of the insulating film beneath the bottom of the gate contact is 3 to 15% thinner than the thickness of the insulating film in the region where the gate contact is not provided.

In the embodiment, a thickness of the first semiconductor region beneath the bottom of the gate contact is 1.4 μm to 2.0 μm.

In the embodiment, an impurity concentration of the first semiconductor region in a region where the gate contact is provided is $5\times10^{16}/cm^3$ to $1\times10^{17}/cm^3$.

In the embodiment, a distance between a side surface of the gate contact on the edge termination region side of the gate contact and an end of the first semiconductor region on the edge termination region side of the first semiconductor region is at least 3.5 μm.

In the embodiment, in the drift layer, a first column of the first conductivity type and a second column of the second conductivity type are arranged on the first main surface so as to repeatedly alternate along a direction parallel to the first main surface.

According to another embodiment of the invention, a semiconductor device includes: a semiconductor substrate of a first conductivity type; a drift layer of the first conductivity type formed on a first main surface of the semiconductor substrate; an active region through which main current flows and formed in a front surface of the drift layer; and a termination region surrounding a periphery of the active region, and a method of manufacturing the semiconductor device includes performing ion implantation and forming a first semiconductor region of a second conductivity type in a surface layer of the drift layer in the termination region; forming a LOCOS oxide film on surfaces of the first semiconductor region in the termination region and the drift layer in the termination region, after performing the ion implantation and forming the first semiconductor region; forming a trench from the surface of the drift region in the active region, in a direction orthogonal to the first main surface; forming a gate insulating film on the drift layer entirely, after forming the trench; depositing poly-silicon on the gate insulting film entirely, after forming the gate insulating film; forming a gate electrode in the trench and a gate wiring in the termination region, after depositing the poly-silicon; forming a well region of the second conductivity type in the surface layer of the drift region in the active region, after forming the gate electrode; forming a source region of the first conductivity type in a surface layer of the first semiconductor layer; forming an interlayer insulating film on the drift layer entirely, after forming the source region; and removing a part of the interlayer insulating film, and forming a gate contact where the gate wiring connected with the gate electrode is in contact with a gate metal. Performing the ion implantation includes extending the first semiconductor region to a region where the gate contact is provided.

In the embodiment, forming the gate contact includes forming a trench contact in the active region concurrently with the gate contact.

Objects, features, and advantages of the present invention are specifically set forth in or will become apparent from the following detailed description of the invention when read in conjunction with the accompanying drawings.

BRIEF DESCRIPTION OF THE DRAWINGS

FIGS. 11 and 12 are cross-sectional views of a conventional SJ-MOSFET during manufacture.

DETAILED DESCRIPTION OF THE INVENTION

Figure 11:
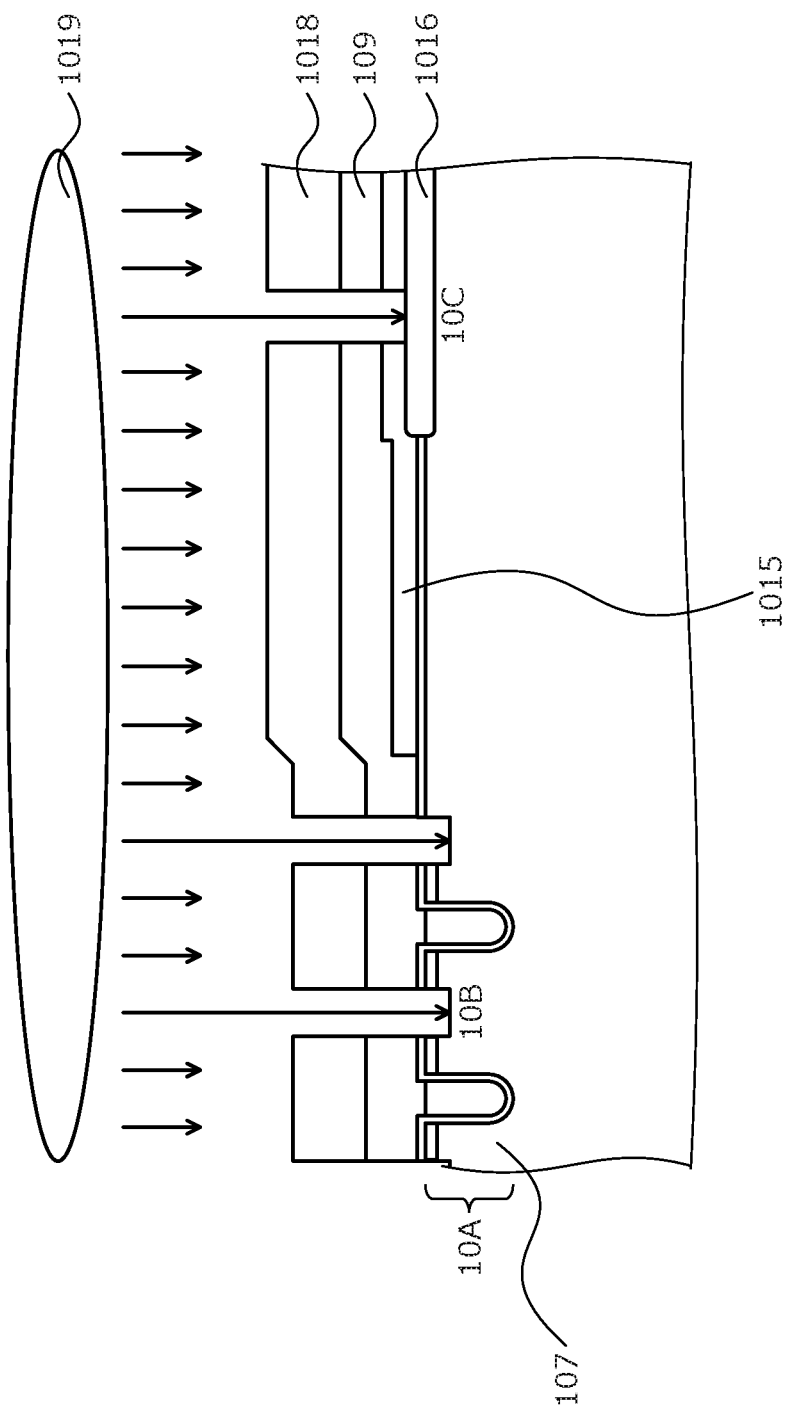

FIGS. 11 and 12 are cross-sectional views of a conventional SJ-MOSFET during manufacture. As depicted in FIG. 11, plasma 1019 is irradiated on a resist 1018 having openings at parts corresponding to the gate contact 10C and the trench contact 10B. Therefore, in the conventional SJ-MOSFET, the gate contact 10C in the edge termination region 1030 and the trench contact 10B in the active region 1020 are formed concurrently.

In this case, the following problems arise. When silicon (the p-type base layer 107) in the active region 1020 is etched, the poly-silicon of the gate wiring 1015 is also etched in the edge termination region 1030. However, the etching rate of the poly-silicon is faster compared to that of the silicon and therefore, before formation of the trench contact 10B in the active region 1020, the poly-silicon in the edge termination region 1030 is completely etched and the LOCOS oxide film 1016 below is exposed to the plasma 1019. As a result, until the trench contact 10B in the active region 1020 reaches a predetermined depth, the LOCOS oxide film 1016 in the edge termination region 1030 is exposed to the plasma 1019. Therefore, as depicted in FIG. 12, the LOCOS oxide film 1016 is also removed by the plasma 1019, becoming thinner beneath the gate contact 10C. For example, when the LOCOS oxide film 1016 is observed by a scanning electron microscope (SEM), the bottom of the gate contact 10C is recessed and thinner. Further, film quality (insulation) of the LOCOS oxide film 1016 is reduced by damage from the plasma 1019.

Figure 10:
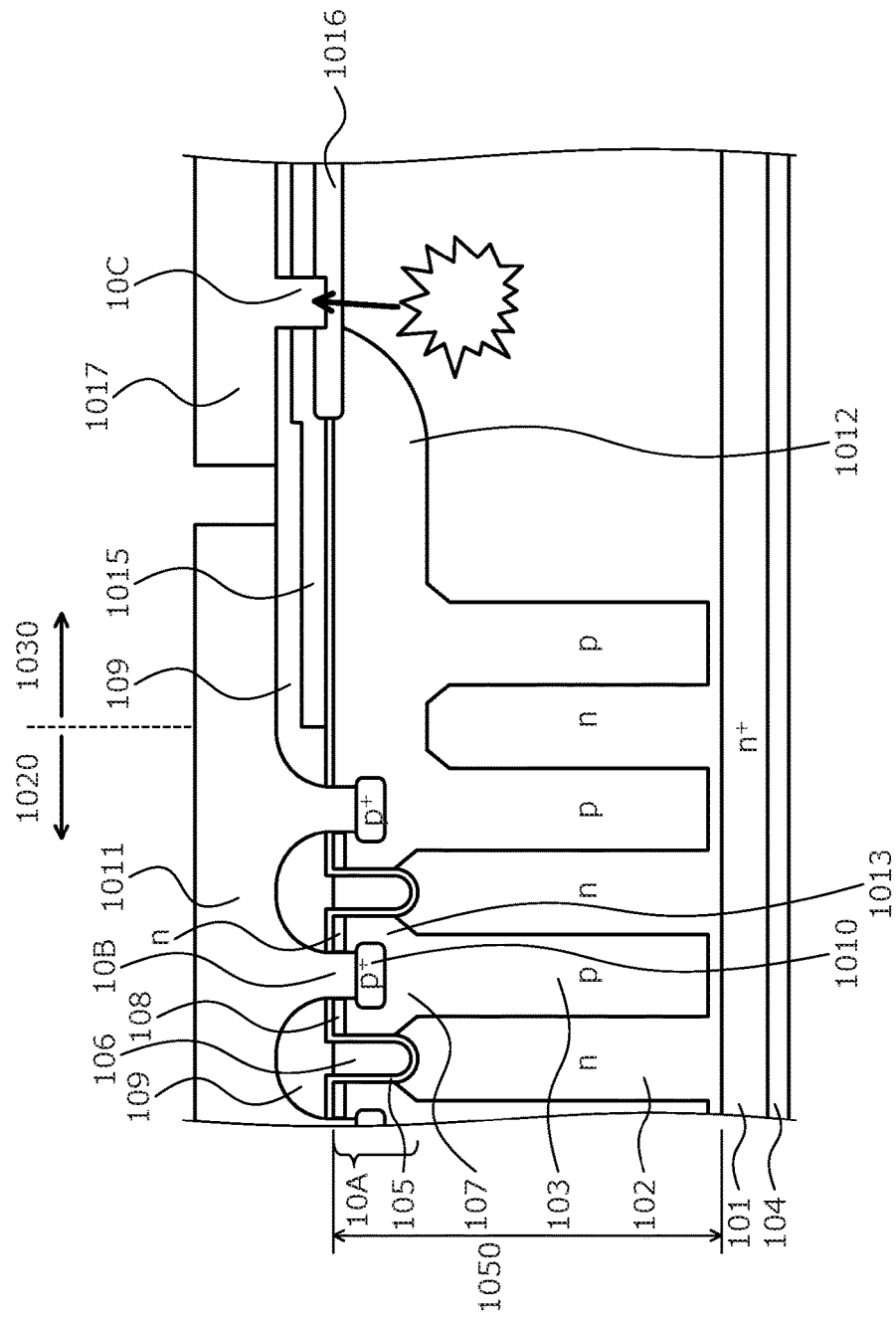
FIG. 10 is a cross-sectional view of a structure of a conventional SJ-MOSFET.

In this way, when the trench contact 10B is formed in the active region 1020, the LOCOS oxide film 1016 beneath the gate contact 10C becomes thin and the film quality (insulation) thereof decreases. In this case, as depicted in FIG. 10, a problem arises in that when avalanche breakdown occurs at the end of the p-type RESURF (reduced surface field) region 1012, current generated by the avalanche breakdown flows to the LOCOS oxide film 1016 that has poor film quality beneath the gate contact 10C, and the element is destroyed.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described.

Figure 1:
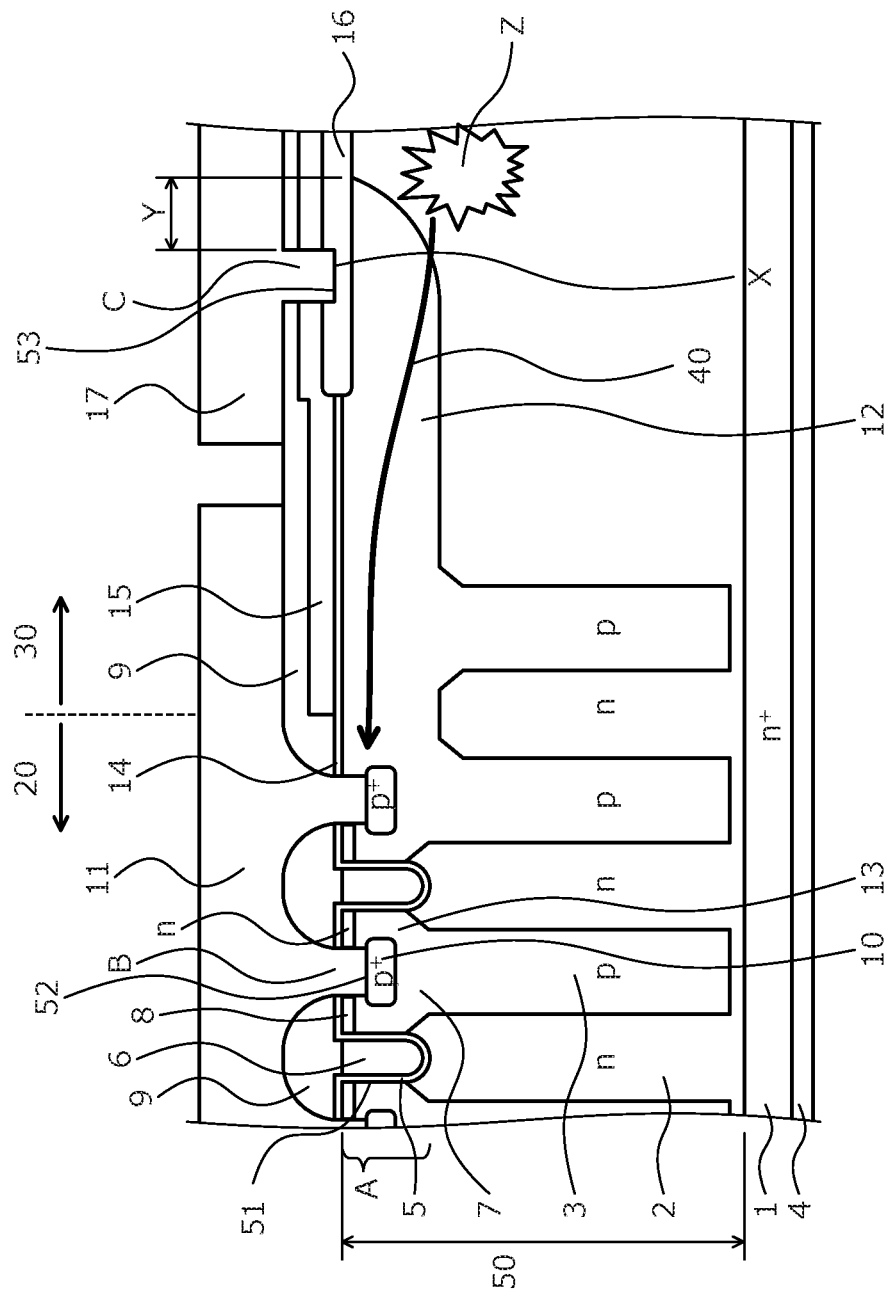
FIG. 1 is a cross-sectional view of a SJ-MOSFET according to an embodiment.

A semiconductor device according to the present invention will be described taking a SJ-MOSFET as an example. FIG. 1 is a cross-sectional view of a SJ-MOSFET according to an embodiment. FIG. 1 depicts only two unit cells (functional units of an element) and other adjacent unit cells are not depicted. The SJ-MOSFET depicted in FIG. 1 is a SJ-MOSFET having a metal oxide semiconductor (MOS) gate on a front surface (surface on a p-type base layer 7 side) side of a semiconductor base (silicon base: semiconductor chip) containing silicon. The SJ-MOSFET has an active region 20 and an edge termination region 30 surrounding a periphery of the active region 20. The active region 20 is a region through which flows in the ON state. The edge termination region 30 is a region that mitigates electric field on a base front surface side of a drift region and sustains the breakdown voltage.

In the silicon base, an n-type drift layer 50 is grown on a front surface of an n$^+$-type semiconductor substrate constituting an n$^+$-type drain layer (semiconductor substrate of the first conductivity type) 1, and in the n-type drift layer 50, an n-type column region 2 and a p-type column region 3 of a SJ structure are alternately provided. The MOS gate is configured by a p-type base layer (first semiconductor layer of the second conductivity type) 7, an n-type source region 8, a p$^+$-type contact region 10, a trench gate A, a trench contact B, a gate insulating film 5, and a gate electrode 6. Further, on a rear surface of the n$^+$-type drain layer 1, a drain electrode 4 is provided.

In the active region 20, the SJ structure is provided. The SJ structure is constituted by the n-type column region 2 and the p-type column region 3 arranged to repeatedly alternate and be joined to each other. The p-type column region 3 is provided from a surface of the n-type drift layer 50 and is provided so as to not reach a surface of the n$^+$-type drain layer 1. A planar shape of the n-type column region 2 and the p-type column region 3 is, for example, a striped shape, a hexagonal lattice, or a square shape. The p-type column region 3 may reach the surface of the n$^+$-type drain layer 1.

In the active region 20, a trench 51 reaching the n-type column region 2 is provided and the gate electrode 6 containing poly-silicon is embedded in the trench 51, via the gate insulating film 5. Thus, the trench gate A is provided. Further, on a top (side facing a source electrode 11) of the p-type column region 3, the p-type base layer 7 is provided and the n-type source region 8 is provided in the p-type base layer 7. On the gate electrode 6, an interlayer insulating film 9 for insulating the source electrode 11 is provided. A trench 52 penetrating the interlayer insulating film 9 is provided in a surface of the p-type base layer 7. At a bottom of the trench 52, the p$^+$-type contact region 10 and the source electrode 11 are connected. At a sidewall of the trench 52, the n-type source region 8 and the source electrode 11 are connected. Thus, the trench contact B is provided.

In an outer periphery of the edge termination region 30, a p-type well region 13 connected to the p-type column region 3 is provided and outside thereof, a p-type RESURF region (first semiconductor region of the second conductivity type) 12 connected to the p-type well region 13 is provided. An impurity concentration of the p-type RESURF region 12 is higher than an impurity concentration of the p-type column region 3. On the p-type RESURF region 12 and the p-type well region 13, an insulating film 14 is provided and via the insulating film 14, a gate wiring 15 is provided. The gate wiring 15 is connected with the gate electrode 6 embedded in the trench 51 provided in the active region 20. On the gate wiring 15, the interlayer insulating film 9 is provided.

At an outer side of the insulating film 14, a LOCOS oxide film 16 is provided. The gate wiring 15 extends on a top of the LOCOS oxide film 16. In the outer periphery of the edge termination region 30, a trench 53 is provided penetrating the interlayer insulating film 9 and the gate wiring 15. In the trench 53, a gate metal 17 is embedded. Thus, a gate contact C where the gate wiring 15 is connected to the gate metal 17 is provided. The gate wiring 15 is connected to a gate pad (not depicted), via the gate metal 17. The gate metal 17 may be aluminum or a metal containing aluminum.

A part of the LOCOS oxide film 16 at a bottom of the trench 53 (part indicated by X in FIG. 1) is thinner due to plasma etching as described hereinafter. In other words, a thickness of the part beneath a bottom of the gate contact C (the bottom of the trench 53) is thinner than a thickness of a part where the gate contact C is not provided. For example, the thickness of the part under the bottom of the gate contact C (the bottom of the trench 53) is 3 to 15% thinner than a thickness of the part where the gate contact C is not provided (a thickness of the LOCOS oxide film 16). Further, for example, the thickness of the LOCOS oxide film 16 is 0.35 µm and the thickness of the part beneath the bottom of the gate contact C (the bottom of the trench 53) is 0.3 µm to 0.34 µm.

Since the LOCOS oxide film 16 is damaged by the plasma etching, the film quality (insulation) decreases, reducing the resistance. This results because, due to the plasma etching, electrons, ions, etc. enter the LOCOS oxide film 16, enabling an energy level at a different location from the original energy level, whereby current flows.

The p-type RESURF region 12 is connected with the p-type well region 13 and extends to a region where the gate contact C is provided, thereby covering the bottom of the gate contact C. A distance Y (part indicated Y by in FIG. 1) between an end of the p-type RESURF region 12 in the edge termination region 30 and a side surface of the gate contact C on the edge termination region 30 side of the gate contact C (side surface of the trench 53 on the edge termination region 30 side of the trench 53), i.e., the side surface facing toward the active region 20, may be at least 3.5 µm. Here, an impurity concentration of the p-type RESURF region 12 may increase with proximity to the surface of the p-type RESURF region 12. This is to decrease the resistance with proximity to the surface and facilitate the flow of current generated by avalanche breakdown. Further, the impurity concentration and thickness of the p-type RESURF region 12 varies according to the breakdown voltage of the SJ-MOSFET. For example, when the breakdown voltage of the SJ-MOSFET is 100 to 150V, the impurity concentration may be $5\times10^{16}/cm^3$ to $1\times10^{17}/cm^3$ and the thickness may be 1.4 µm to 2.0 µm. A planar shape of the trench contact B and the gate contact C may be a striped shape or a dot shape.

In this manner, the p-type RESURF region 12 covers the bottom of the gate contact C whereby an avalanche capability point that occurs moves away from the bottom of the gate contact C to a position farther toward the outside (part indicated by Z in FIG. 1). Further, although the resistance of the LOCOS oxide film 16 is decreased due to damage, a resistance of a p-type region is even lower and therefore, the current generated by avalanche breakdown is discharged from the p-type RESURF region 12 (p-type region) immediately to the source electrode 11, via the p-type well region 13 (refer arrow 40 in FIG. 1). In this way, the current generated by avalanche breakdown does not flow to the LOCOS oxide film 16 whose thickness beneath the gate contact C is thinner and therefore, destruction of the element may be prevent. Thus, the SJ-MOSFET of the present embodiment may achieve high avalanche capability.

Figure 2:
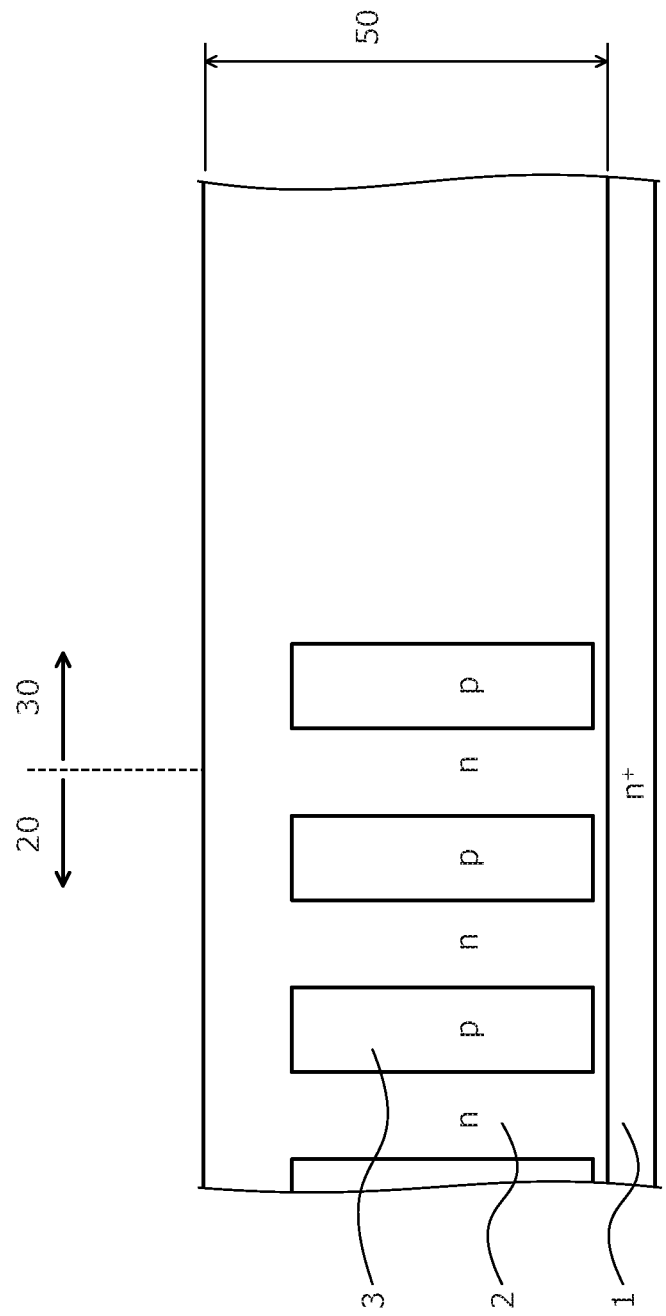
FIGS. 2, 3, 4, 5, 6, and 7 are cross-sectional views of the SJ-MOSFET according to the embodiment during manufacture.

The method of manufacturing a semiconductor device according to the embodiment will be described. FIGS. 2, 3, 4, 5, 6, and 7 are cross-sectional views of the SJ-MOSFET according to the embodiment during manufacture. First, an $n^+$-type semiconductor substrate containing silicon and constituting the $n^+$-type drain layer 1 is prepared. Next, epitaxial growth and ion implantation are repeatedly performed to form the SJ structure constituted by the n-type column regions 2 and the p-type column regions 3 on the front surface of the $n^+$-type drain layer 1. The state up to here is depicted in FIG. 2. A region in which the n-type column regions 2 and the p-type column regions 3 are not provided constitutes the n-type drift layer 50. Further, the SJ structure may be such that the n-type drift layer 50 is formed on the front surface of the $n^+$-type drain layer 1 by epitaxial growth; a trench is formed from an upper surface of the n-type drift layer 50 to a position where the p-type column region 3 is to be formed; and a semiconductor layer forming the p-type column region 3 is embedded in the trench.

Figure 3:
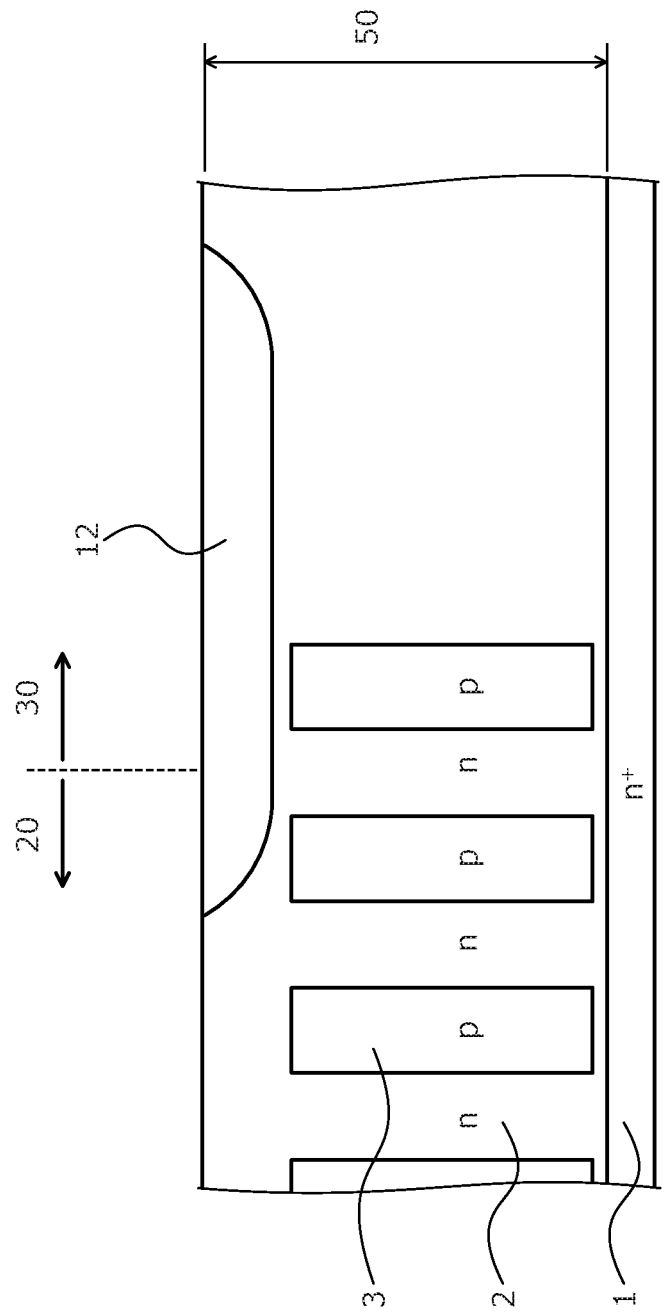

Next, a mask is formed by photolithography and etching, and ion implantation of a p-type impurity is performed to form the p-type RESURF region 12 in a surface layer of the n-type drift layer 50 on the edge termination region 30 side. The p-type RESURF region 12 is formed from the p-type column region 3 that is outermost in the active region 20 to a region where the gate contact C is formed, at a depth not reaching the p-type column region 3. The state up to here is depicted in FIG. 3.

Figure 4:
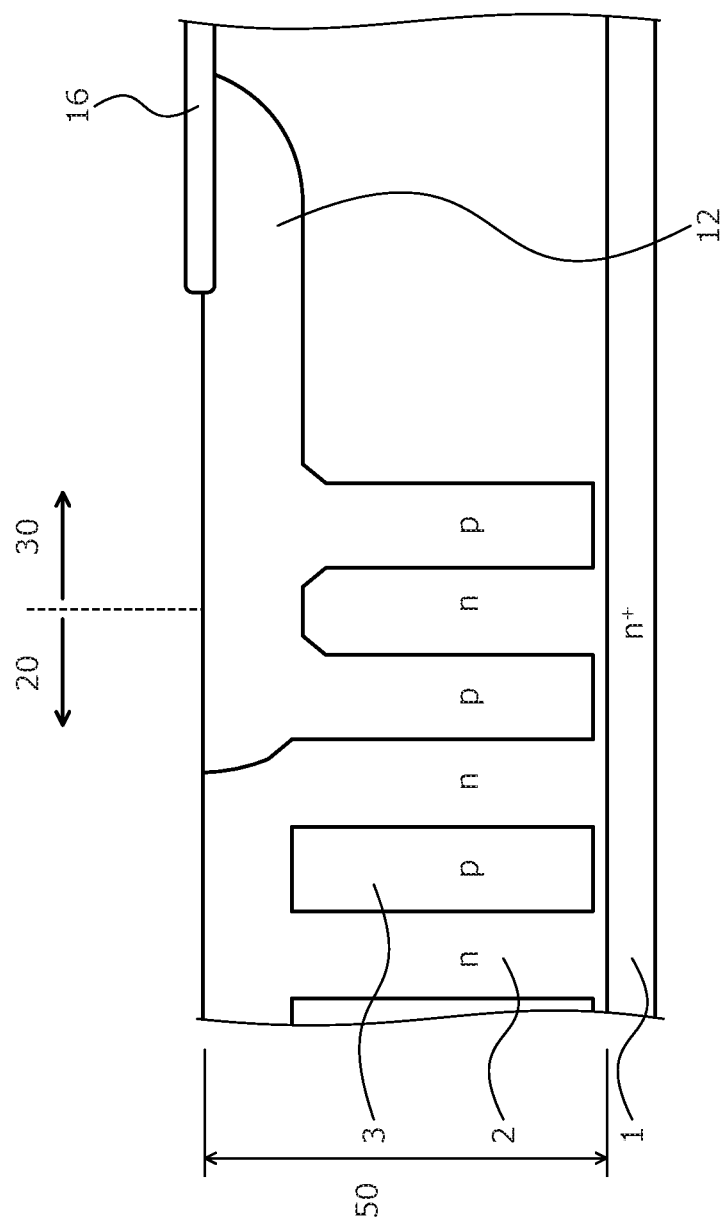

Next, in an atmosphere containing water vapor such as an atmosphere for wet $O_2$ (oxygen) oxidation, pyrogenic oxidation, etc., high-temperature heat treatment is performed for a long period of time to cause oxidation and form the LOCOS oxide film 16 in the edge termination region 30. Due to the heat treatment at this time, the p-type RESURF region 12 spreads to become connected with the p-type column regions 3. The LOCOS oxide film 16 is formed on surfaces of the p-type RESURF region 12 and the n-type drift layer 50 in the edge termination region 30. The state up to here is depicted in FIG. 4.

Figure 5:
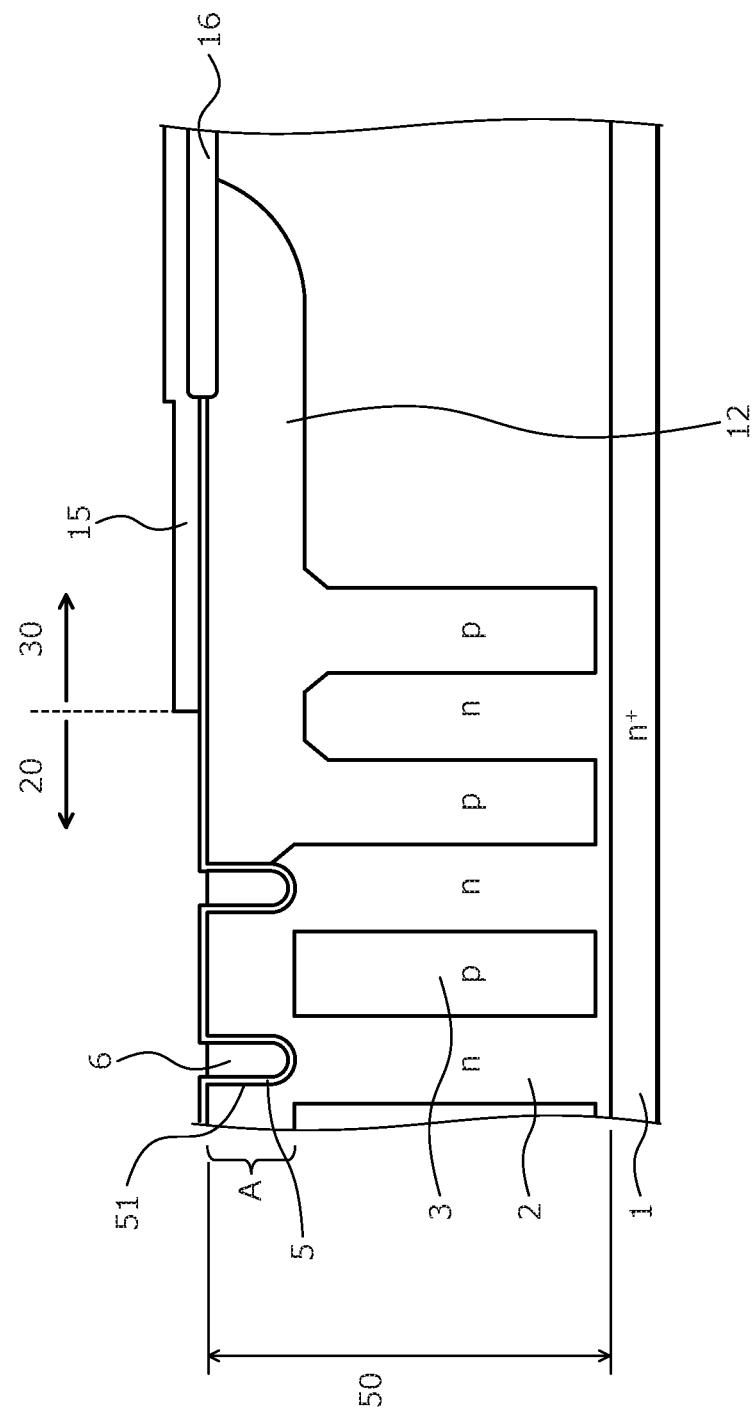

Next, the trench gate A is formed in the active region 20. The trench 51 is formed to reach the n-type column region 2 from a top of the front surface of the n-type drift layer 50. An oxide mask is used as a mask during trench formation. Next, along the front surface of the n-type drift layer 50 and along sidewalls of the trench 51, the gate insulating film 5 is formed. Next, for example, poly-silicon is deposited so as to be embedded in the trench 51 and a part in the active region 20 is etched to leave the poly-silicon constituting the gate electrode 6 in the trench 51 and form the trench gate A, and the edge termination region 30, the poly-silicon constituting the gate wiring 15 is left. Here, when the poly-silicon embedded in the trench 51 is etched, etching may be such that the poly-silicon remains deeper than the surface of the n-type drift layer 50, or patterning and etching may be performed whereby the poly-silicon protrudes outward from the surface of the n-type drift layer 50. The state up to here is depicted in FIG. 5.

Next, on the front surface of the n-type drift layer 50, an ion implantation mask (not depicted) having a predetermined opening is formed by a photolithography technique using, for example, an oxide film. Ion implantation of a p-type impurity is performed using the ion implantation mask as a mask to form the p-type base layer 7 in the surface layer of the n-type drift layer 50. Next, the ion implantation mask is removed.

Figure 6:
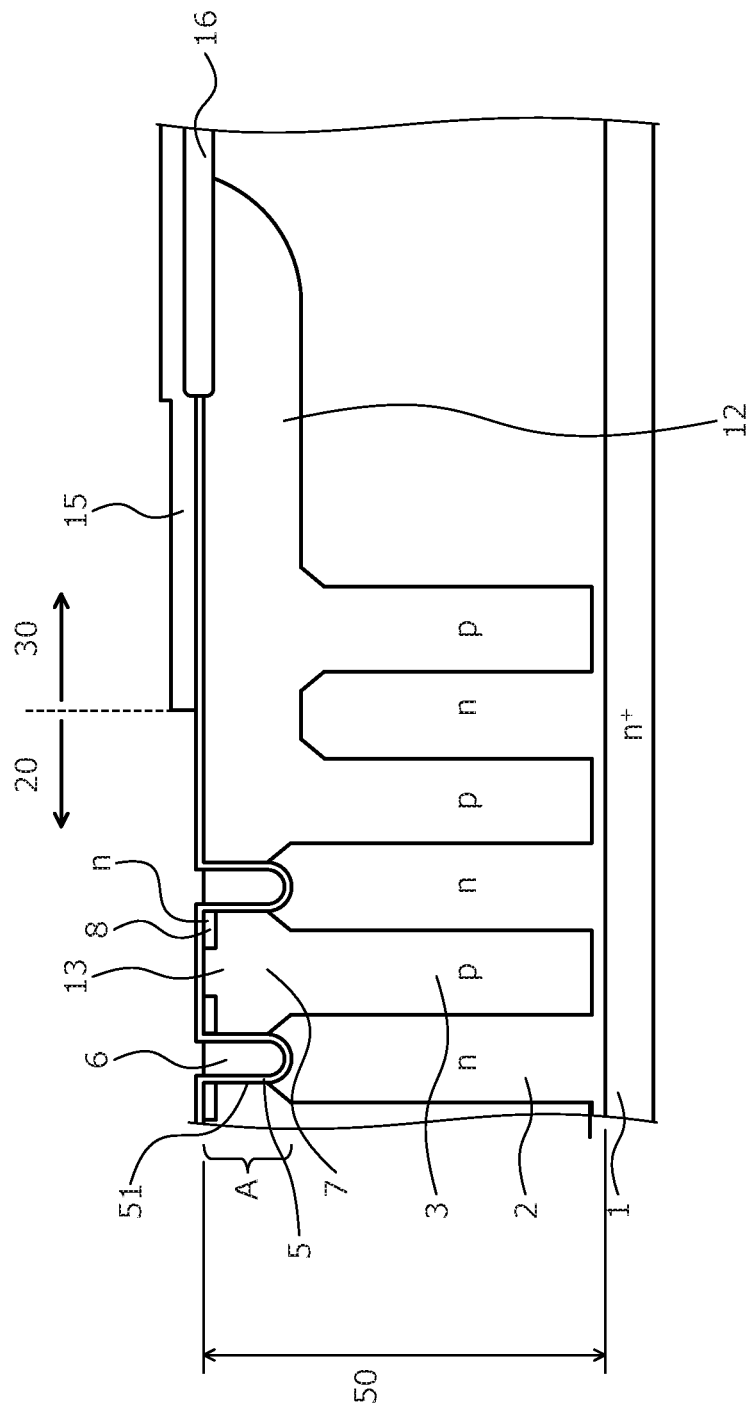

On the surface of the p-type base layer 7, an ion implantation mask (not depicted) having predetermined openings is formed by a photolithography technique using, for example, an oxide film. Ion implantation of an n-type impurity is performed using the ion implantation mask as a mask to form the n-type source region 8 in a surface layer of the p-type base layer 7. Next, the ion implantation mask is removed. The state up to here is depicted in FIG. 6.

Next, the interlayer insulating film 9 is formed on the entire front surface of the n-type drift layer 50. The interlayer insulating film 9 is formed using, for example, borophosphosilicate glass (BPSG). Next, a reflow process is performed to planarize the interlayer insulating film 9. The interlayer insulating film 9 may be formed using a non-doped silicate glass (NSG), phosphosilicate glass (PSG), a high temperature oxide (HTO), or a combination thereof.

Next, the trench contact B reaching the p-type base layer 7 in the active region 20 and the gate contact C reaching the LOCOS oxide film 16 in the edge termination region 30 are concurrently formed. Concurrent formation of the trench 52 forming the trench contact B and the trench 53 forming the gate contact C enables a reduction of man-hours. An oxide mask is used as a mask during trench formation. For example, a mask (not depicted) having openings at parts corresponding to the gate contact C and the trench contact B is irradiated with plasma whereby the trench 53 is formed at a position where the gate contact C is to be formed and the trench 52 is concurrently formed at positions where the trench contact B is to be formed. Here, the LOCOS oxide film 16 at the bottom of the trench 53 (under the bottom of the gate contact C) is damaged by the plasma etching and therefore, becomes thinner and the film quality (insulation) decreases. Provided the etching is anisotropic etching, etching other than plasma etching such as dry etching may be performed.

Figure 7:
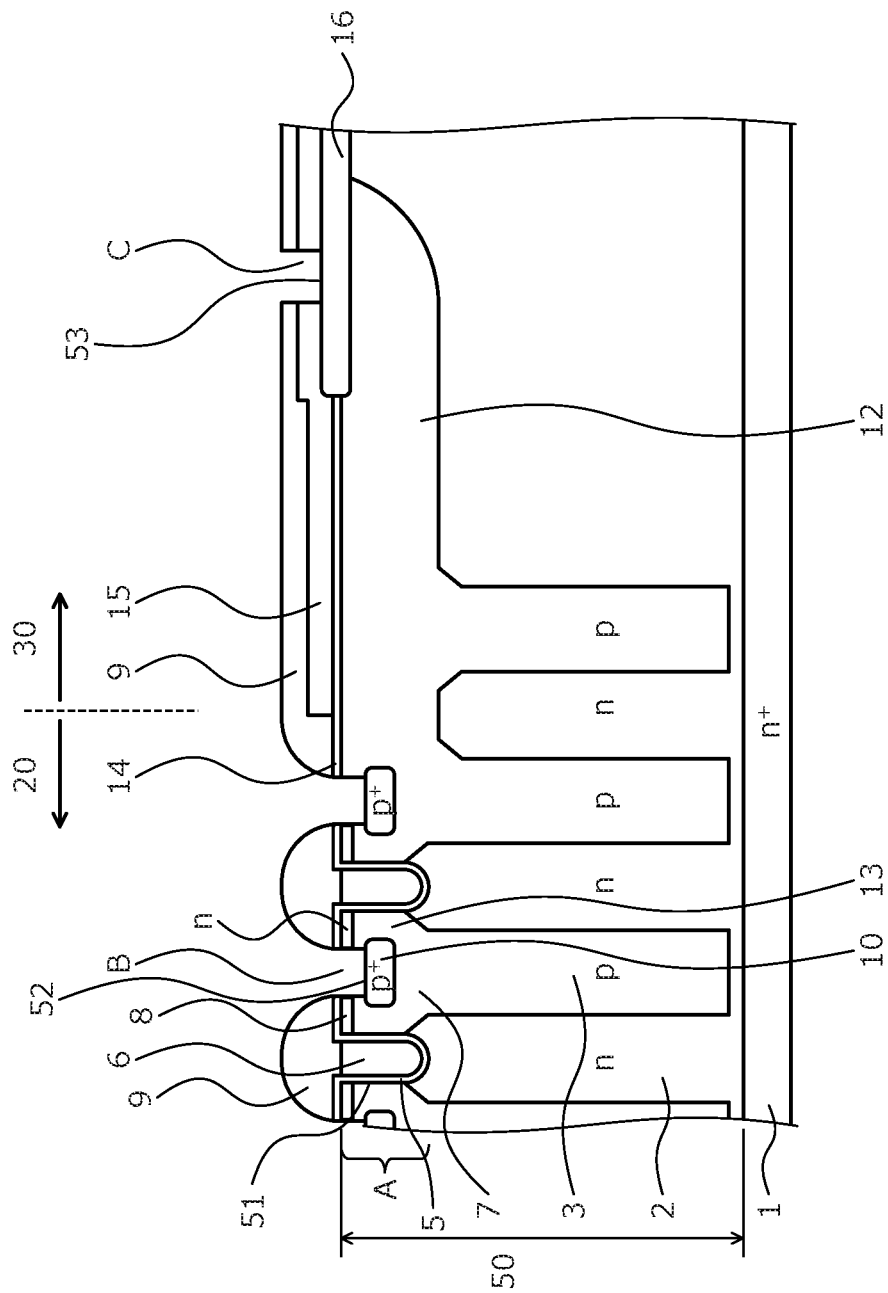

Next, at the bottom of the trench 52, ion implantation of a p-type impurity is performed, forming the $p^+$-type contact region 10 in the p-type base layer 7, an impurity concentration of the p+-type contact region 10 being higher than an impurity concentration of the p-type base layer 7. Next, activation annealing is performed with respect to the ion implanted regions. For example, the activation annealing is performed at a temperature of 950 degrees C. As a result, impurities ion implanted in the n-type source region 8, the p+-type contact region 10, the p-type RESURF region 12, and the p-type well region 13 are activated. The state up to here is depicted in FIG. 7.

Next, a barrier metal (not depicted) containing titanium (Ti) or titanium nitride (TiN) is formed so as to cover the interlayer insulating film 9. The barrier metal is patterned, exposing the n-type source region 8, the p+-type contact region 10, and the gate wiring 15. Next, the source electrode 11 is formed so as to be in contact with the n-type source region 8 and the p+-type contact region 10. The source electrode 11 may be formed so as to cover the barrier metal, or to remain only in the trench 52. To prevent poor coverage of an Aluminum-copper alloy of the source electrode 11, a tungsten (W) plug may be used. Next, the gate metal 17 is formed so as to be in contact with the gate wiring 15. A barrier metal, a tungsten (W) plug, etc. may also be used in the trench 53.

Next, a source pad (not depicted) is formed so as to be embedded in the trench 52. A part of a metal layer deposited to form the source pad may be used as the gate pad. On the rear surface of the n+-type drain layer 1, a metal film such as a nickel (Ni) film, a titanium (Ti) film, etc. is formed at a contact part of the drain electrode 4 by sputter deposition or the like. The metal film may be a stacked combination of Ni films and Ti films. Next, annealing such as rapid thermal annealing (RTA) is performed so as to convert the metal film into a silicide and form an ohmic contact. Thereafter, for example, a thick film such as a stacked film in which a Ti film, a Ni film, and a gold (Au) film are sequentially stacked, is formed by electron beam (EB) evaporation, etc., thereby forming the drain electrode 4.

In the described epitaxial growth and ion implantation, for example, nitrogen (N), phosphorus (P), arsenic (As), antimony (Sb), etc. (n-types with respect to silicon) may be used as an n-type impurity (n-type dopant). As a p-type impurity (p-type dopant), for example, boron (B), aluminum (Al), gallium (Ga), indium (In), thallium (Tl), etc. (p-types with respect to silicon) may be used. In this way, the SJ-MOSFET depicted in FIG. 1 is completed.

Figure 8:
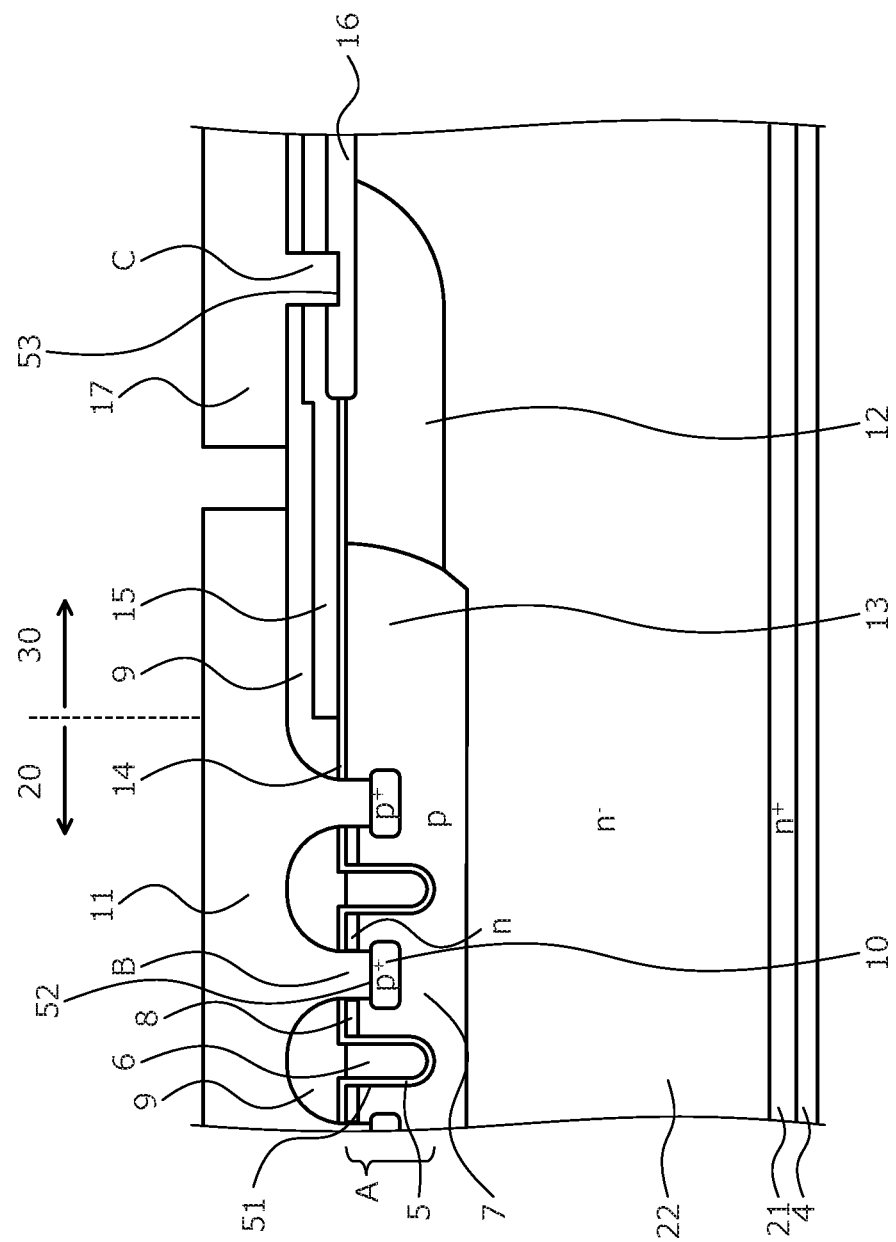
FIG. 8 is a cross-sectional view of a structure of a MOSFET according to an embodiment.
Figure 9:
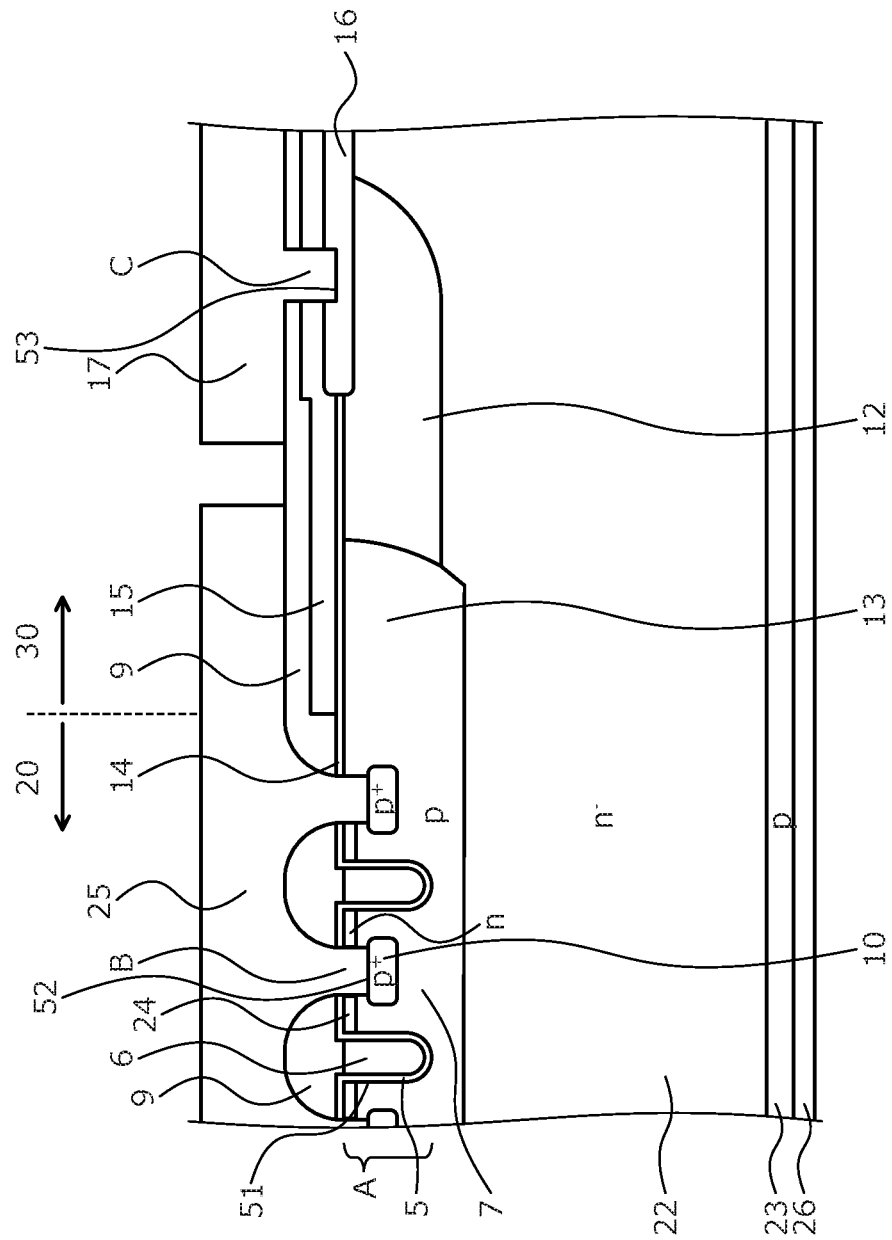
FIG. 9 is a cross-sectional view of a structure of an IGBT according to an embodiment.

In the embodiments, while a SJ-MOSFET has been described as an example, the present invention is applicable to insulated gate bipolar transistors (IGBTs), MOSFETs having trench contacts and gate contacts. FIG. 8 is a cross-sectional view of a structure of a MOSFET according to an embodiment. In FIG. 8, reference numerals 21 and 22 are an n+-type semiconductor substrate and an n−-type drift layer, respectively. Other components are similar to the components of the SJ-MOSFET depicted in FIG. 1 and therefore, are omitted hereinafter. FIG. 9 is a cross-sectional view of a structure of an IGBT according to an embodiment. In FIG. 9, reference numerals 23, 24, 25, and 26 are a p-type contact layer, an n-type emitter layer, an emitter electrode, and a collector electrode, respectively. Other components are similar to the components of the SJ-MOSFET depicted in FIG. 1 and therefore, are omitted hereinafter.

As described, according to the embodiment, the p-type RESURF region extends to the region where the gate contact is provided and covers the bottom of the gate contact. As a result, the current generated by avalanche breakdown is discharged from the p-type RESURF region immediately to the source electrode, via the p-type well region. Therefore, in the semiconductor device having trench gates and trench contacts, high avalanche capability may be achieved.

In the present invention, while a case where a MOS gate structure is provided on a first main surface of a silicon substrate has been described as an example, without limitation hereto, various modifications are possible such in the semiconductor type (for example, silicon carbide (SiC), etc.), plane orientation of the substrate main surface, etc. Further, in the embodiments, although the first conductivity type is assumed to be an n-type and the second conductivity type is assumed to be a p-type, the present invention is similarly implemented when the first conductivity type is a p-type and the second conductivity type is an n-type.

According to the embodiments, the p-type RESURF region (first semiconductor region of the second conductivity type) extends to the region where the gate contact is formed and covers the gate contact at the bottom of the gate contact. As a result, the current generated by avalanche breakdown is discharged from p-type RESURF region immediately to the source electrode, via the p-type well region. Therefore, in the semiconductor device having trench gates and trench contacts, high avalanche capability may be achieved.

The semiconductor device and the method of manufacturing a semiconductor device according to the present invention achieve an effect in that application to trench gates and trench contacts is possible, high voltage and low ON resistance are realized, and avalanche capability may be increased.

As described, the semiconductor device and the method of manufacturing a semiconductor device according to the present invention are useful for high-voltage semiconductor devices used in power converting equipment and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device including an active region for main current thereof to flow therein and an edge termination region surrounding a periphery of the active region, the semiconductor device comprising:
   a semiconductor substrate of a first conductivity type;
   a drift layer of the first conductivity type provided on a first main surface of the semiconductor substrate;
   a semiconductor layer of a second conductivity type provided in a surface layer of the drift layer;
   a trench, formed in the active region, reaching the drift layer from a surface of the semiconductor layer;
   a gate electrode provided in the trench, via a gate insulating film;
   a gate metal formed in the edge termination region and connected with the gate electrode;
   a gate contact formed in the edge termination region, the gate contact having a top thereof in contact with the gate metal, and a bottom; and
   a semiconductor region of the second conductivity type provided in the surface layer of the drift layer and extending from the active region to the edge termination region, the semiconductor region being connected with the semiconductor layer and the bottom of the gate contact.

2. The semiconductor device according to claim 1, further comprising
an insulating film provided in the edge termination region, between the semiconductor region and the gate metal, wherein
a thickness of the insulating film beneath the bottom of the gate contact is thinner than the thickness of the insulating film in a region where the gate contact is not provided.

3. The semiconductor device according to claim 2, wherein
the thickness of the insulating film beneath the bottom of the gate contact is 3 to 15% thinner than the thickness of the insulating film in the region where the gate contact is not provided.

4. The semiconductor device according to claim 1, wherein
a thickness of the semiconductor region beneath the bottom of the gate contact is 1.4 μm to 2.0 μm.

5. The semiconductor device according to claim 1, wherein
an impurity concentration of the semiconductor region beneath the bottom of the gate contact is $5 \times 10^{16}/cm^3$ to $1 \times 10^{17}/cm^3$.

6. The semiconductor device according to claim 1, wherein
the semiconductor region ends in the edge termination region at an end thereof, and
a shortest distance between a side surface of the gate contact and the end of the semiconductor region in the edge termination region, in a direction in parallel to the surface layer of the drift layer, is at least 3.5 μm.

7. The semiconductor device according to claim 1, further comprising a first column of the first conductivity type and a second column of the second conductivity type that are arranged in the drift layer and repeatedly alternate along a direction parallel to the first main surface of the semiconductor substrate.

8. A method of manufacturing a semiconductor device that includes an active region through which main current thereof flows and an edge termination region surrounding a periphery of the active region, the method comprising:
providing a semiconductor substrate of a first conductivity type, with a drift layer of the first conductivity type provided on a first main surface thereof;
performing ion implantation and forming a semiconductor region of a second conductivity type in a surface layer of the drift layer;
subsequently forming a local oxidation of silicon (LOCOS) oxide film on a surface of the semiconductor region in the edge termination region and a surface of the drift layer in the edge termination region;
forming a trench from the surface of the drift layer in the active region, in a direction orthogonal to the first main surface of the semiconductor substrate;
forming a gate insulating film on the entire surface of the drift layer and a side wall of the trench formed therein;
depositing poly-silicon on the gate insulating film, to thereby form a gate electrode in the trench and a gate wiring in the edge termination region;
forming a well region of the second conductivity type in the surface layer of the drift layer in the active region, after forming the gate electrode;
forming a source region of the first conductivity type in the surface layer of the drift layer;
forming an interlayer insulating film on the entire drift layer, after forming the source region; and
removing a part of the interlayer insulating film, and forming a gate contact and a gate metal so that the gate wiring is in contact with the gate metal via the gate contact, wherein
the performing ion implantation includes extending the semiconductor region to a region where the gate contact is to be provided.

9. The method according to claim 8, wherein
forming the gate contact includes forming a trench contact in the active region concurrently with the gate contact.

* * * * *